US009293073B2

(12) United States Patent
Chen

(10) Patent No.: US 9,293,073 B2
(45) Date of Patent: Mar. 22, 2016

(54) TESTING SYSTEM

(75) Inventor: Cheng-Hung Chen, Shenzhen (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 1072 days.

(21) Appl. No.: 13/381,071

(22) PCT Filed: Dec. 16, 2011

(86) PCT No.: PCT/CN2011/084100
§ 371 (c)(1), (2), (4) Date: Dec. 27, 2011

(87) PCT Pub. No.: WO2013/086729
PCT Pub. Date: Jun. 20, 2013

(65) Prior Publication Data

US 2013/0154679 A1 Jun. 20, 2013

(30) Foreign Application Priority Data

Dec. 14, 2011 (CN) .......................... 2011 1 0418247

(51) Int. Cl.
*G01R 31/20* (2006.01)
*G09G 3/00* (2006.01)

(52) U.S. Cl.
CPC ..................................... *G09G 3/006* (2013.01)

(58) Field of Classification Search
USPC .................... 324/754.1, 537, 754.01, 754.03
See application file for complete search history.

(56) References Cited

U.S. PATENT DOCUMENTS 5,639,390 A * 6/1997 Iino et al. ................. 219/121.65
7,525,118 B2 * 4/2009 Nakamura et al. .............. 257/48
7,619,436 B2 * 11/2009 Kwak ...................... 324/760.02
2003/0122976 A1 * 7/2003 Choi et al. ...................... 349/40
2005/0046439 A1 * 3/2005 Yu .......................... G09G 3/006 324/760.02
2006/0001792 A1 * 1/2006 Choi ............................... 349/54
2006/0152245 A1 * 7/2006 Ahn et al. ..................... 324/769
2007/0030408 A1 * 2/2007 Lin et al. .......................... 349/40
2007/0040178 A1 * 2/2007 Chang ................... G02F 1/1362 257/72
2007/0046336 A1 * 3/2007 Kang et al. .................... 326/101
2008/0129327 A1 * 6/2008 Kim ...................... G02F 1/1309 324/750.3

* cited by examiner

*Primary Examiner* — Tung X Nguyen
*Assistant Examiner* — Giovanni Astacio-Oquendo

(57) ABSTRACT

Disclosed is a testing system, which includes a thin film transistor substrate. The thin film transistor substrate includes a plurality of thin film transistors and a plurality of connecting pads. Each of the thin film transistors includes a first electrode, a second electrode, and a third electrode. The thin film transistor substrate further includes a testing pad. One of the first electrode and the second electrode of each of the thin film transistors is electrically connected with one of the connecting pads. The third electrode and the other one of the first electrode and the second electrode of each of the thin film transistors are electrically connected with the testing pad. The testing system of the present invention is capable of decreasing the cost of the testing system and the complexity of disposed circuits.

10 Claims, 2 Drawing Sheets

TESTING SYSTEM

BACKGROUND OF THE INVENTION

1. Field of the Invention

The present invention generally relates to a testing technology field, and more particularly to a testing system capable of reducing testing cost.

2. Description of Prior Art

A liquid crystal display device mainly comprises a liquid crystal panel and a backlight module. The liquid crystal panel comprises a thin film transistor (TFT) substrate, a color filter (CF) substrate, and a liquid crystal layer disposed between the TFT substrate and the CF substrate.

In polymer stabilization vertical aligned processes, array processes, cell processes, or other processes, the TFT substrate is required to be tested for checking whether functions of elements (such as thin film transistors) on the TFT substrate are normal.

Please refer to FIG. 1, which shows a testing system in the prior arts. The testing system comprises a probe frame 10, a plurality of probes 12, and a TFT substrate 14. The probes 12 are disposed at the probe frame 10 and made of elastic metallic material. Before testing, a plurality of pad P1~P5 is required to be manufactured on the TFT substrate 14 and elements (not shown) which are required to receive input signals are respectively and electrically connected with the pads P1~P5. When testing, the probes 12 of the probe frame 10 are correspondingly aligned to and contact with the pads P1~P5 for checking whether functions of the elements on the TFT substrate 14 are normal.

However, there might exist misalignments between the probes 12 of the probe frame 10 and the corresponding pads P1~P5, or lengths of the probes 12 are different since the probes 12 fail to be restored elastically after long term usage, so that the probes 12 have poor contact with the corresponding pads P1~P5 and wrong testing results are produced.

To improve the above-mentioned problem of poor contact, another testing system in the prior arts is shown in FIG. 2. A difference between the testing systems in FIG. 1 and FIG. 2 is that the testing system in FIG. 2 comprises the pads P1~P5 and pads P1'~P5'. The pads P1~P5 are respectively and electrically connected with the pads P1'~P5'. That is, a quantity of the pads in FIG. 2 is twice a quantity of the pads in FIG. 1. Take the pads P1 and P1' for example, when testing, one of the pads P1 and P1' can be randomly selected for being applied by a testing signal. The problem of whether the poor contact occurs can be determined by detecting the other one of the pads P1 and P1'. When the problem of the poor contact occurs, the alignments between the probes 12 of the probe frame 10 and the corresponding pads P1~P5 and P1'~P5 are adjusted or the position of the TFT substrate 14 is adjusted.

However, since the quantity of the pads in the testing system in FIG. 2 is twice the quantity of the pads in the testing system in FIG. 1, the cost of the testing system and the complexity of disposed circuits on the TFT substrate 14 are increased.

Therefore, there is a need to solve the above-mentioned problems of the testing system in the prior arts.

SUMMARY OF THE INVENTION

An objective of the present invention is to provide a testing system to solve the technical problems that the cost is high and the disposed circuits are complicated in the testing system in the prior arts.

To solve the above-mentioned problem, the present invention provides a testing system comprising a thin film transistor substrate and a plurality of probes. The thin film transistor substrate comprises a plurality of thin film transistors and a plurality of connecting pads. Each of the thin film transistors comprises a first electrode, a second electrode, and a third electrode. The thin film transistor substrate further comprises a testing pad. One of the first electrode and the second electrode of each of the thin film transistors is electrically connected with one of the connecting pads. The third electrode and the other one of the first electrode and the second electrode of each of the thin film transistors are electrically connected with the testing pad. The testing pad has a direct current voltage. It is determined whether the connecting pads have poor contact with the corresponding probes by respectively detecting whether the connecting pads have the direct current voltage.

In the testing system of the present invention, the first electrode is a source electrode, the second electrode is a drain electrode, and the third electrode is a gate electrode.

To solve the above-mentioned problem, the present invention further provides a testing system comprising a thin film transistor substrate. The thin film transistor substrate comprises a plurality of thin film transistors and a plurality of connecting pads. Each of the thin film transistors comprises a first electrode, a second electrode, and a third electrode. The thin film transistor substrate further comprises a testing pad. One of the first electrode and the second electrode of each of the thin film transistors is electrically connected with one of the connecting pads. The third electrode and the other one of the first electrode and the second electrode of each of the thin film transistors are electrically connected with the testing pad.

In the testing system of the present invention, the testing system further comprises a plurality of probes. The probes respectively and correspondingly contact with the connecting pads and the testing pad.

In the testing system of the present invention, a testing signal is applied to the testing pad through the probe which contacts with the testing pad, and it is determined whether the connecting pads have poor contact with the corresponding probes by respectively detecting whether the connecting pads have the testing signal.

In the testing system of the present invention, the first electrode is a source electrode, the second electrode is a drain electrode, and the third electrode is a gate electrode.

Another objective of the present invention is to provide a testing system to solve the technical problems that the cost is high and the disposed circuits are complicated in the testing system in the prior arts.

To solve the above-mentioned problem, the present invention provides a testing system comprising a thin film transistor substrate. The thin film transistor substrate comprises a plurality of thin film transistors and a plurality of connecting pads. Each of the thin film transistors comprises a first electrode, a second electrode, and a third electrode. The thin film transistor substrate further comprises a first testing pad and a second testing pad. One of the first electrode and the second electrode of each of the thin film transistors is electrically connected with the first testing pad. The other one of the first electrode and the second electrode of each of the thin film transistors is electrically connected with one of the connecting pads. The third electrode of each of the thin film transistors is electrically connected with the second testing pad.

In the testing system of the present invention, the testing system further comprises a plurality of probes. The probes respectively and correspondingly contact with the connecting pads, the first testing pad, and the second testing pad.

In the testing system of the present invention, a first testing signal is applied to the first testing pad through the probe which contacts with the first testing pad, a second testing signal is applied to the second testing pad through the probe which contacts with the second testing pad, and it is determined whether the connecting pads have poor contact with the corresponding probes by respectively detecting whether the connecting pads have the first testing signal.

In the testing system of the present invention, the first electrode is a source electrode, the second electrode is a drain electrode, and the third electrode is a gate electrode.

Compared with the prior arts, the present invention solves the technical problems that the cost is high and the disposed circuits are complicated in the testing system in the prior arts.

For a better understanding of the aforementioned content of the present invention, preferable embodiments are illustrated in accordance with the attached figures for further explanation:

DETAILED DESCRIPTION OF THE INVENTION

The following descriptions for the respective embodiments are specific embodiments capable of being implemented for illustrations of the present invention with referring to appended figures.

Figure 3:
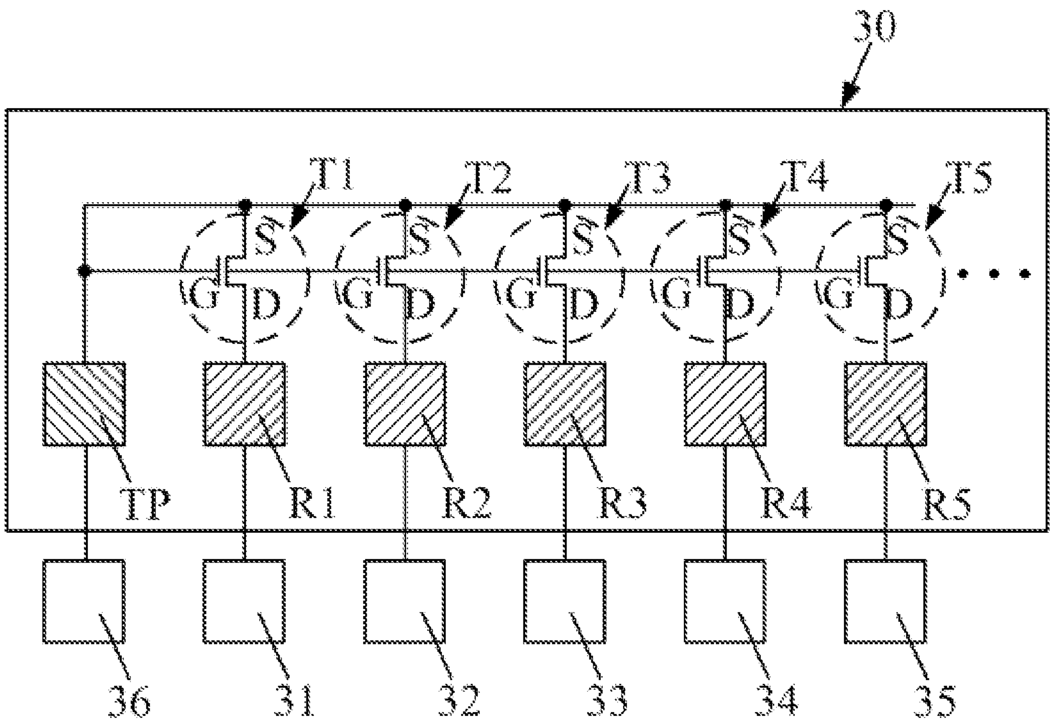
FIG. 3 shows a testing system according to a preferable embodiment of the present invention.

Please refer to FIG. 3, which shows a testing system according to a preferable embodiment of the present invention.

The testing system comprises a thin film transistor substrate 30. The thin film transistor substrate 30 comprises a plurality of thin film transistors T1~T5, a plurality of connecting pads R1~R5, and a testing pad TP. Each of the thin film transistors T1~T5 comprises a first electrode, a second electrode, and a third electrode. In the present embodiment, the first electrode is a source electrode S, the second electrode is a drain electrode D, and the third electrode is a gate electrode G. The thin film transistors T1~T5 are elements which are required to be tested on the thin film transistor substrate 30.

In the testing system of the present invention, the drain electrode D of each of the thin film transistors T1~T5 is correspondingly and electrically connected with one of the connecting pads R1~R5, and the source electrode S and the gate electrode G of each of the thin film transistors T1~T5 are electrically connected with the testing pad TP.

The testing system further comprises a plurality of probes 31~36. The probes 31~35 respectively and correspondingly contact with the connecting pads R1~R5, and the probe 36 contacts with the testing pad TP.

The processes of determining whether the connecting pads R1~R5 have poor contact with the corresponding probes 31~35 are described in the following. Firstly, a testing signal is applied to the testing pad TP through the probe 36 which contacts with the testing pad TP. It is determined whether the connecting pads R1~R5 have poor contact with the corresponding probes 31~35 by respectively detecting whether the connecting pads R1~R5 which contact with the corresponding probes 31~35 have the testing signal.

For example, the testing signal is a direct current voltage of 10 volts. It is determined whether the connecting pads R1~R5 have poor contact with the corresponding probes 31~35 by detecting whether the voltage of each of the connecting pads R1~R5 is equal to 10 volts. For example, when the voltage detected from the connecting pad R1 is not equal to 10 volts, this means that the connecting pad R1 has poor contact with the corresponding probe 31. Accordingly, the alignments between the connecting pads R1~R5 and the corresponding probes 31~35 are required to be adjusted, or the position of the thin film transistor substrate 30 is required to be adjusted.

After the connecting pads R1~R5 are verified to have good contact with the corresponding probes 31~35, the testing results in the following processes, such as polymer stabilization vertical aligned processes, array processes, cell processes, or other processes, can be ensured to be correct.

In the present embodiment, the drain electrode D of each of the thin film transistors T1~T5 is correspondingly and electrically connected with one of the connecting pads R1~R5, and the gate electrode G and the source electrode S of each of the thin film transistors T1~T5 are electrically connected with the testing pad TP. It is noted that uses of the drain electrode D and the source electrode S of each of the thin film transistors T1~T5 can be exchanged according to the applied testing signal. As a result, in another embodiment, the same function as that in FIG. 3 can be implemented by correspondingly and electrically connecting the source electrode S of each of the thin film transistors T1~T5 with one of the connecting pads R1~R5 and electrically connecting the gate electrode G and the drain electrode D of each of the thin film transistors T1~T5 with the testing pad TP.

Figure 4:
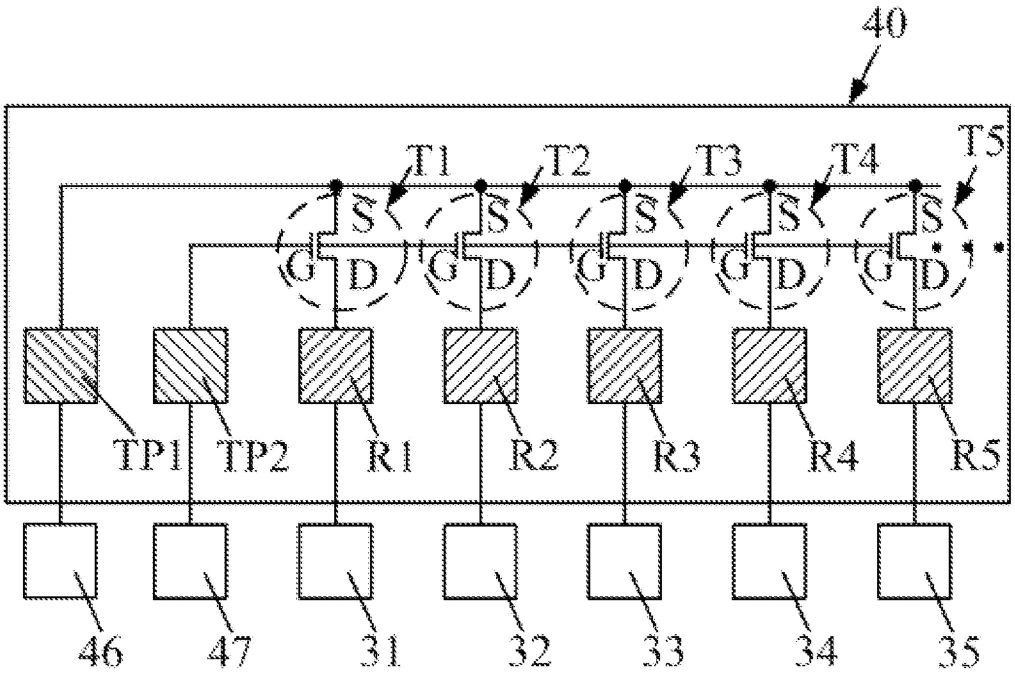
FIG. 4 shows a testing system according to another preferable embodiment of the present invention.

Please refer to FIG. 4, which shows a testing system according to another preferable embodiment of the present invention.

The testing system comprises a thin film transistor substrate 40. The thin film transistor substrate 40 comprises a plurality of thin film transistors T1~T5, a plurality of connecting pads R1~R5, a first testing pad TP1, and a second testing pad TP2. The thin film transistors T1~T5, the connecting pads R1~R5, and the electrical connections between the drain electrode D of each of the thin film transistors R1~R5 and one of the connecting pads R1~R5 are the same as those in FIG. 3, and thus they are not described in detail herein. The thin film transistors T1~T5 are elements which are required to be tested on the thin film transistor substrate 30.

A difference between FIG. 3 and FIG. 4 is that the thin film transistor substrate 40 in FIG. 4 comprises two testing pads, that is, the first testing pad TP1 and the second testing pad TP2. Furthermore, the electrical connections of the gate electrode G and the source electrode S of each of the thin film transistors T1~T5, the first testing pad TP1, and the second testing pad TP2 are different from those in FIG. 3 as well.

As shown in FIG. 4, the source electrode S of each of the thin film transistors T1~T5 is electrically connected with the first testing pad TP1, and the gate electrode G of each of the thin film transistors T1~T5 is electrically connected with the second testing pad TP2.

The testing system further comprises a plurality of probes 31~35 and 46~47. The probes 31~35 are the same as those in FIG. 3, that is, respectively contact with the connecting pads R1~R5. The probe 46 contacts with the first testing pad TP1. The probe 47 contacts with the second testing pad TP2.

The processes of determining whether the connecting pads R1~R5 have poor contact with the corresponding probes 31~35 are described in the following. Firstly, a first testing signal is applied to the first testing pad TP1 through the probe 46 which contacts with the first testing pad TP1, a second testing signal is applied to the second testing pad TP2 through the probe 47 which contacts with the second testing pad TP2. It is determined whether the connecting pads R1~R5 have poor contact with the corresponding probes 31~35 by respectively detecting whether the connecting pads R1~R5 which contact with the corresponding probes 31~35 have the first testing signal.

For example, the first testing signal is a direct current voltage of 10 volts, and the second testing signal is a direct current voltage of 5 volts. It is determined whether the connecting pads R1~R5 have poor contact with the corresponding probes 31~35 by detecting whether the voltage of each of the connecting pads R1~R5 is equal to 10 volts. For example, when the voltage detected from the connecting pad R2 is not equal to 10 volts, this means that the connecting pad R2 has poor contact with the corresponding probe 32. Accordingly, the alignments between the connecting pads R1~R5 and the corresponding probes 31~35 are required to be adjusted, or the position of the thin film transistor substrate 40 is required to be adjusted.

After the connecting pads R1~R5 are verified to have good contact with the corresponding probes 31~35, the testing results in the following processes, such as polymer stabilization vertical aligned processes, array processes, cell processes, or other processes, can be ensured to be correct.

In the present embodiment, the drain electrode D of each of the thin film transistors T1~T5 is correspondingly and electrically connected with one of the connecting pads R1~R5, the source electrode S of each of the thin film transistors T1~T5 is electrically connected with the first testing pad TP1, and the gate electrode G of each of the thin film transistors T1~T5 is electrically connected with the second testing pad TP2. It is noted that uses of the drain electrode D and the source electrode S of each of the thin film transistors T1~T5 can be exchanged according to the applied testing signal(s). As a result, in another embodiment, the same function as that in FIG. 4 can be implemented by correspondingly and electrically connecting the source electrode S of each of the thin film transistors T1~T5 with one of the connecting pads R1~R5, electrically connecting the drain electrode D of each of the thin film transistors T1~T5 with the first testing pad TP1, and electrically connecting the gate electrode G of each of the thin film transistors T1~T5 with the second testing pad TP2.

Figure 1:
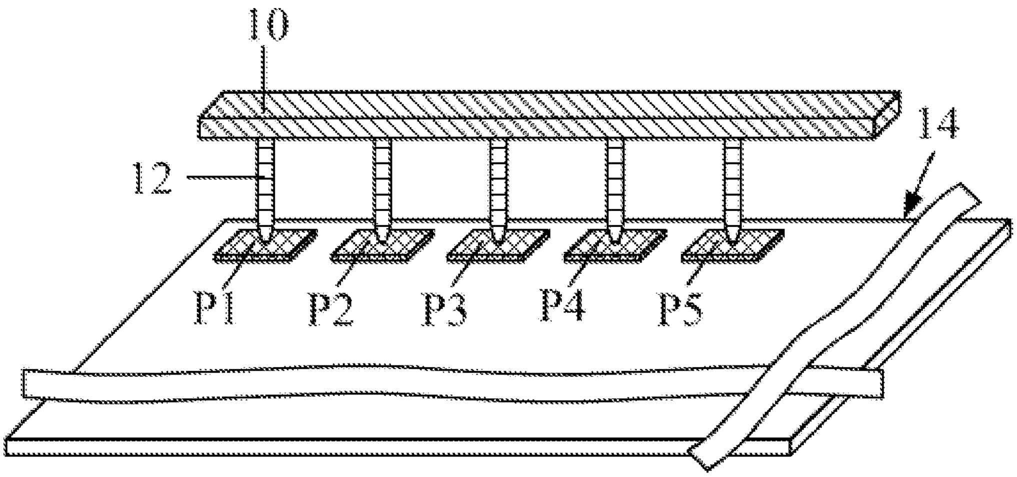
FIG. 1 (PRIOR ART)
FIG. 1 shows a testing system in the prior arts.
Figure 2:
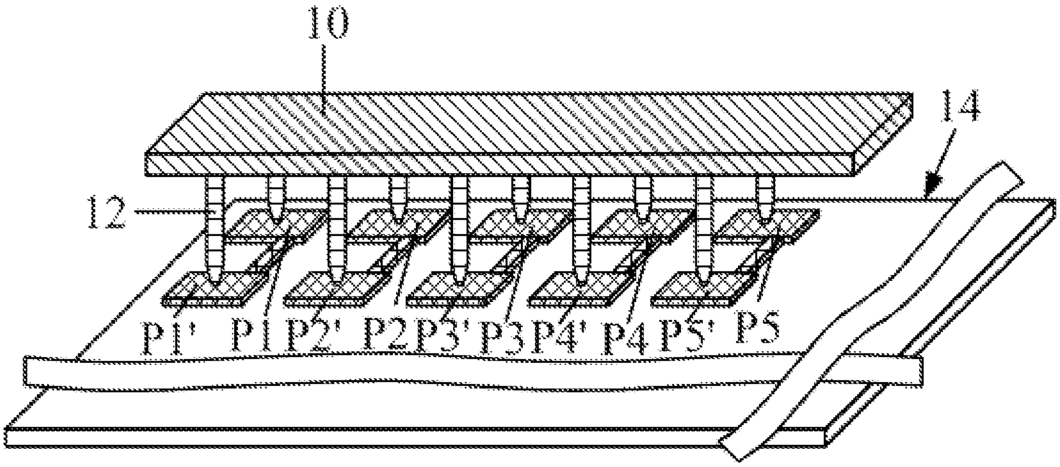
FIG. 2 (PRIOR ART)
FIG. 2 shows another testing system in the prior arts.

Compared with the thin film transistor substrate 14 requiring a group of pads P1'~P5' to be added in FIG. 2, the present invention can determine whether the connecting pads R1~R5 have poor contact with the corresponding probes 31~35 by adding only one testing pad (as shown in FIG. 3) or two testing pads (as shown in FIG. 4). Accordingly, the complexity of disposed circuits on the thin film transistor can be significantly simplified. Furthermore, since only one testing pad (as shown in FIG. 3) or two testing pads (as shown in FIG. 4) are required, the quantity of probes can be decreased, so that the cost of the testing system can be reduced.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A testing system, comprising a thin film transistor substrate and a plurality of probes, the thin film transistor substrate comprising a plurality of thin film transistors and a plurality of connecting pads, each of the thin film transistors comprising a first electrode, a second electrode, and a third electrode, wherein the thin film transistor substrate further comprises a testing pad, one of the first electrode and the second electrode of each of the thin film transistors is electrically connected with one of the connecting pads, the third electrode and the other one of the first electrode and the second electrode of each of the thin film transistors are electrically connected with the testing pad, the thin film transistors are elements which are required to be tested on the thin film transistor substrate, the testing pad has a direct current voltage, it is determined whether the connecting pads have poor contact with the corresponding probes by respectively detecting whether the connecting pads have the direct current voltage, each of the thin film transistors electrically connected with the corresponding one of the connecting pads is directly connected to the testing pad.

2. The testing system of claim 1, wherein the first electrode is a source electrode, the second electrode is a drain electrode, and the third electrode is a gate electrode.

3. A testing system, comprising a thin film transistor substrate, the thin film transistor substrate comprising a plurality of thin film transistors and a plurality of connecting pads, each of the thin film transistors comprising a first electrode, a second electrode, and a third electrode, wherein the thin film transistor substrate further comprises a testing pad, one of the first electrode and the second electrode of each of the thin film transistors is electrically connected with one of the connecting pads, the third electrode and the other one of the first electrode and the second electrode of each of the thin film transistors are electrically connected with the testing pad, the thin film transistors are elements which are required to be tested on the thin film transistor substrate, each of the thin film transistors electrically connected with the corresponding one of the connecting pads is directly connected to the testing pad.

4. The testing system of claim 3, further comprising a plurality of probes, the probes respectively and correspondingly contacting with the connecting pads and the testing pad.

5. The testing system of claim 4, wherein a testing signal is applied to the testing pad through the probe which contacts with the testing pad, and it is determined whether the connecting pads have poor contact with the corresponding probes by respectively detecting whether the connecting pads have the testing signal.

6. The testing system of claim 3, wherein the first electrode is a source electrode, the second electrode is a drain electrode, and the third electrode is a gate electrode.

7. A testing system, comprising a thin film transistor substrate, the thin film transistor substrate comprising a plurality of thin film transistors and a plurality of connecting pads, each of the thin film transistors comprising a first electrode, a second electrode, and a third electrode, wherein the thin film transistor substrate further comprises a first testing pad and a second testing pad, one of the first electrode and the second electrode of each of the thin film transistors is electrically connected with the first testing pad, the other one of the first electrode and the second electrode of each of the thin film transistors is electrically connected with one of the connecting pads, and the third electrode of each of the thin film transistors is electrically connected with the second testing pad, the thin film transistors are elements which are required to be tested on the thin film transistor substrate, each of the thin film transistors electrically connected with the corresponding one of the connecting pads is directly connected to the testing pad.

8. The testing system of claim 7, further comprising a plurality of probes, the probes respectively and correspondingly contacting with the connecting pads, the first testing pad, and the second testing pad.

9. The testing system of claim 8, wherein a first testing signal is applied to the first testing pad through the probe which contacts with the first testing pad, a second testing signal is applied to the second testing pad through the probe which contacts with the second testing pad, and it is determined whether the connecting pads have poor contact with the corresponding probes by respectively detecting whether the connecting pads have the first testing signal.

10. The testing system of claim 7, wherein the first electrode is a source electrode, the second electrode is a drain electrode, and the third electrode is a gate electrode.

* * * * *